United States Patent [19]

Kunze

[11] 4,393,314
[45] Jul. 12, 1983

[54] CIRCUIT ARRANGEMENT FOR THE GENERATION OF A SAWTOOTH VOLTAGE

[75] Inventor: Dieter Kunze, Kaltenkirchen, Fed. Rep. of Germany

[73] Assignee: U.S. Philips Corporation, New York, N.Y.

[21] Appl. No.: 209,774

[22] Filed: Nov. 24, 1980

[30] Foreign Application Priority Data

Dec. 6, 1979 [DE] Fed. Rep. of Germany ....... 2949066

[51] Int. Cl.³ ............................................. H03K 4/08
[52] U.S. Cl. ................................... 307/228; 307/271; 328/181
[58] Field of Search ................ 328/181, 185; 307/228, 307/271; 323/287

[56] References Cited

U.S. PATENT DOCUMENTS 3,571,617  3/1971  Hainz ................................. 328/185
3,577,012  5/1971  Dummermuth ..................... 328/181
4,145,650  3/1979  Poppinger et al. ................. 323/287
4,225,825  9/1980  Watts ................................. 328/185

Primary Examiner—Stanley D. Miller
Assistant Examiner—B. P. Davis
Attorney, Agent, or Firm—Thomas A. Briody; William J. Streeter; Laurence A. Wright

[57] ABSTRACT

Circuit arrangement for generating a sawtooth voltage which has a substantially nominal frequency in the absence of synchronization pulses, whereby the changeover to direct synchronizability takes place as soon as a synchronization pulse comes into coincidence with the sawtooth flyback. In this way a phase change is avoided when the changeover is made. The changeover to nominal frequency occurs as soon as a pulse fails to occur within the natural period effective in case of direct synchronization. A threshold value circuit has an intermediate value which prevents synchronization by interference pulses occurring prematurely.

13 Claims, 3 Drawing Figures

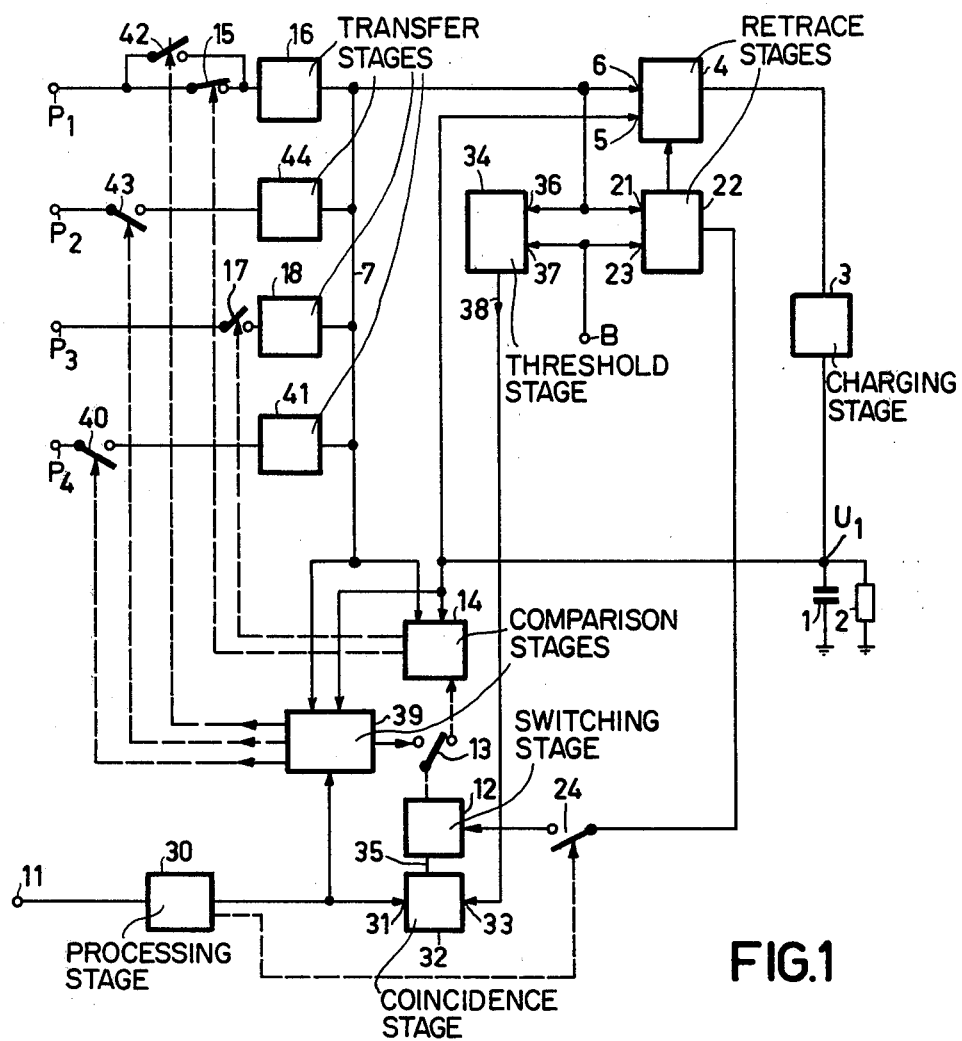
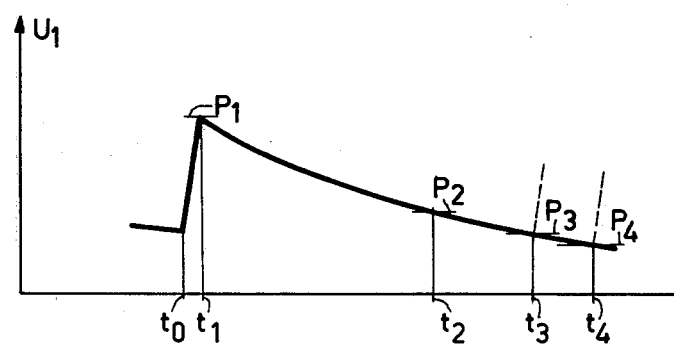
FIG.1
FIG.2

CIRCUIT ARRANGEMENT FOR THE GENERATION OF A SAWTOOTH VOLTAGE

The invention concerns a circuit arrangement for the generation of a sawtooth voltage by a capacitor which is charged by a first current until a first threshold voltage is reached and is discharged by a second current until a second threshold voltage is reached, whereby at the instant that one of said threshold voltages is reached the direction and or the intensity of the direct current supplied to the capacitor is changed, and whereby the differences between the first and the second threshold voltage and between the charge and the discharge current determine the natural frequency of the sawtooth voltage generated, and whereby said natural frequency can be switched under the influence of a synchronisation signal detector for establishing the presence of the synchronisation signal, and whereby at least one of the two capacitor charge switching instants can be determined by synchronisation signals be supplied having a substantially constant nominal repetition frequency, the sawtooth voltage being thus synchronisable by said synchronisation signals, and whereby said natural frequency is given substantially the nominal value in the absence of synchronisation signals.

BACKGROUND OF THE INVENTION

A circuit of this type, which can be used for example in the horizontal deflection circuit of a television receiver, was proposed in our co-pending European patent application No. 79200687.6, not pre-published.

The synchronisation signal detector can establish the presence of the synchronising pulses by means of peak rectification; as a rule a time constant becomes effective here, e.g. through a change in the mean charging condition of a capacitor, so that the necessary switching can only take place after a certain time. Then phase synchronisation is usually necessary as well, as that the whole pull-in process takes a considerable time.

An object of the invention is to have the switching take place at the same time as the synchronisation without a disturbing delay, so that the synchronised state is reached instantaneously. This can e.g. be used for the synchronisation of the horizontal deflection in a television receiver. Particularly when a line frequency signal is used simultaneously for switching another stage, e.g. for the production of a supply voltage or for the high voltage generation, disturbing frequency variations, which may result in voltage fluctuations, can be largely avoided.

SUMMARY OF THE INVENTION

The circuit arrangement according to the invention is characterized in that the synchronization signal detector is implemented as a coincidence stage to which a signal corresponding to a determined time interval, of the sawtooth voltage and a signal corresponding to a determined time interval of the incoming synchronisation signal are supplied and which on coincidence of these two signals supplied a signal to a switching stage for switching the natural frequency of the sawtooth circuit arrangement from a value corresponding at least substantially to the nominal frequency to a lower value.

When synchronisation signals occur which are not yet in synchronisation with, for example, the retrace of the sawtooth, however, this progresses unchanged, preferably at roughly the nominal frequency. The sawtooth is not switched until the coincidence in question occurs and exact phase concordance is achieved instantaneously. A pull-in process during which the television image is unsteady for a while or runs with perturbed synchronisation, is thus avoided. If on the other hand the synchronisation pulses disappear, e.g. because the receiver is being tuned in to another programme, the sawtooth is only substantially lengthened for a single period. There is then an instantaneous switching to the nominal frequency so that connected stages, such as the high voltage generator or a switched power supply, continue to operate at least approximately at their nominal frequency.

The circuit is preferably designed in such a way that the retrace commences when a synchronisation pulse occurs, the natural frequency having its lower value and this not until a give time or voltage interval has elapsed from the beginning of the period. Interference arising in the initial part of the trace can then cause no erroneous synchronisation. In a further development of the invention a switching signal is supplied to a switching stage which switches an oscillator circuit determining the frequency of the sawtooth voltage from a value substantially equal to the nominal frequency to a lower value when coincidence is present and switches it back to the original situations in the absence of coincidence.

The frequency of the sawtooth voltage is preferably switched back again to the nominal frequency by a second switching signal initiated by the retrace of the sawtooth voltage with a longer natural period.

In a special embodiment the invention deals with a circuit arrangement characterized in that threshold voltages are supplied to a comparison stage by means of a transfer stage, the capacitor voltage being also supplied to said comparison stage which supplies a switching signal if the two voltages supplied are at least substantially equal, the transfer stage being formed by a differential amplifier stage whose output branches are supplied through a current mirror circuit and which is connected to an impedance transformer, the threshold voltage being transferred to the comparison stage through the differential amplifier, this transfer being effected by means of one of a switching signal supplied by a switching stage, by which the supply current common to both stages of the differential amplifier is switched.

In a further embodiment of the circuit arrangement of the invention two transfer stages can be applied, whereby their supply current is switched alternatively by the comparison stage which is activated depending on the sign of the difference between the sawtooth voltage and the threshold voltage.

A further embodiment is characterized by three transfer stages, whereby the first transfer stage is switched on alternatively to the second and the third transfer stages by a (second) comparison stage, whereby switching transistors are arranged in such a way that the transfer stage which is connected to the lower threshold voltage conducts current. Usefully for synchronisation the common current branch of the transfer stage associated with the longer sawtooth period and driven by the parallel transistors of the comparison stage is interrupted. In this way it becomes possible to render a synchronisation possible only when a value of the sawtooth voltage corresponding to the second voltage level is reached. Pulses occurring beforehand, e.g. by disturbances, do not become effective.

In another embodiment this ineffectiveness is obtained in particular when the transistors in the comparison stage, whose collectors supply the current for the second and the third transfer stages form a parallel arrangement such that when the current to the third transfer stage is interrupted, the second transfer stage conducts current, if the capacitor voltage is higher than the threshold voltage applied to the second transfer stage.

BRIEF DESCRIPTION OF THE DRAWINGS

The invention will now be explained in greater detail with reference to the accompanying drawings wherein:

FIG. 1 is a principle circuit diagram of the invention;

FIG. 2 shows the course of the sawtooth voltage obtained; and

DETAILED DESCRIPTION OF THE PREFERRED EMBODIMENTS

Figure 3:
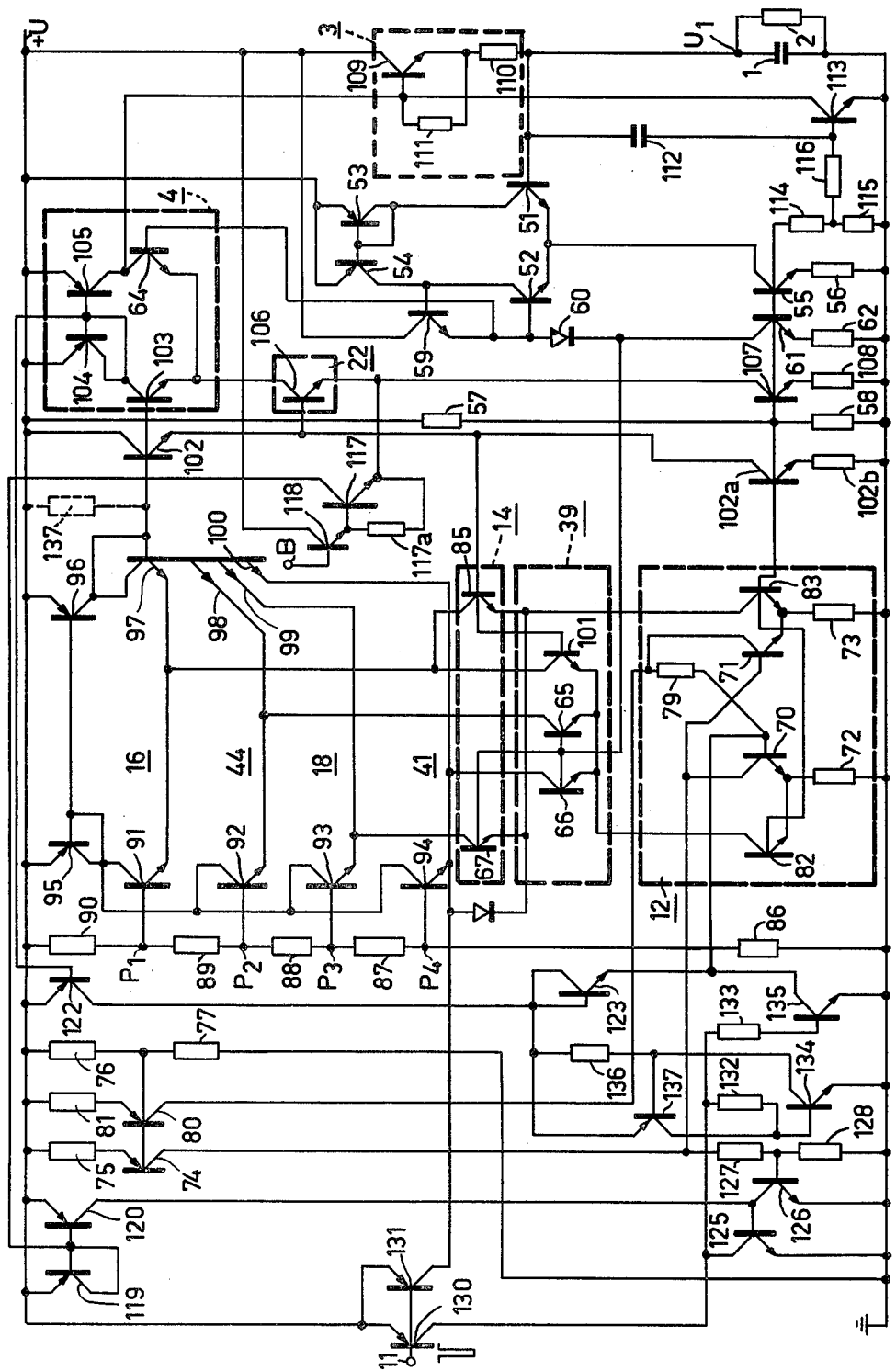
FIG. 3 is a detailed circuit diagram of the invention.

At a capacitor 1, to which a discharging resistor 2 is connected in parallel, as in FIG. 1, a voltage $U_1$ rising to an upper threshold value potential $P_1$ is generated by means of a charging stage 3 in an interval $t_0$ to $t_1$, subsequently called retrace. This can be seen from FIG. 2. During the next interval, called trace, the charging stage 3 is inactive, and the voltage at the capacitor 1 decreases exponentially and thus with a certain approximation proportionally with time until the charging stage 3 is switched on again. The charging stage 3 is periodically activated by a retrace switching stage 4, whose input 5 is connected to the sawtooth voltage $U_1$ of the capacitor 1, while its input 6 is connected to a lead 7 bearing a certain voltage level. When the lead 7 bears a level $P_1$ of e.g. 5.2 volts, the charging stage 3 is switched on by the retrace switching stage 4 until the voltage $U_1$ of the capacitor 1 has reached the value $P_1$; then the charging process is ended and the discharging of the capacitor 1 begins via the resistor 2.

As long as no synchronisation pulses arrive at the circuit from input 11, comparison stage 14 is activated by switching stage 12 through switch 13 represented schematically. The threshold voltage on lead 7 and voltage $U_1$ of capacitor 1 are fed to comparison stage 14. In the starting position switch 15 activated by the output of stage 14 is closed in such a way that the potential $P_1$ is effectively on lead 7 by way of transfer stage 16. As long as voltage $U_1$ is lower than $P_1$ the circuit remains as shown and capacitor $C_1$ is quickly charged in the retrace between the instants $t_0$ and $t_1$. When the capacitor voltage $U_1$ has reached the value $P_1$ comparison stage 14 causes switch 15 to open and switch 17 to close so that a potential $P_3$ of e.g. 3.5 V is effective on the lead 7 by way of a transfer stage 18.

FIG. 2 shows the course of the voltage $U_1$: the retrace begins at the instant $t_0$, until at the instant $t_1$ the voltage value $P_1$ is reached. Then the retrace switching stage 4 is blocked; the trace begins with the discharge through the resistor 2. The potential $P_3$ is kept on lead 7 by comparison stage 14 until the voltage $U_1$ falls below the value $P_3$. Then switch 17 is opened by comparison stage 14 and switch 15 closed, so that the upper potential value $P_1$ again lies on lead 7. The voltage difference of inputs 5 and 6 of stage 4 changes correspondingly, charging stage 3 is switched on and the next retrace is carried out.

The potential on lead 7 lies also at an input 21 of retrace stage 22, on another input 23 of which lies a fixed voltage B of e.g. 3.9 volts, which is somewhat lower than the voltage corresponding to the highest possible value $P_1$ on the lead 7. Stage 22 is therefore always active when the value $P_1$ is present on the lead 7. Stage 22 then supplies a control signal for the retrace switching stage 4 and thereby makes it possible for charging stage 3 to be switched on. Stage 22 also supplies a pulse occurring in the retrace interval which is fed via switch 24 to switching stage 12 and controls it so that switch 13 is moved into the position shown, so that comparison stage 14 is active. In this way it can be guaranteed that in the absence of synchronisation pulses the change of the charge of the capacitor voltage $U_1$ always takes place between level $P_1$ and level $P_3$. FIG. 2 shows that the voltage $U_1$ reaches the value $P_3$ at an instant $t_3$; this has been chosen so that the interval $t_0$ to $t_3$ represents the period of the nominal frequency, which e.g. at least approximately corresponds to the line frequency of a television standard.

When synchronisation pulses occur at the terminal 11 they are transferred to an input 31 of a coincidence stage 32 via a processing stage 30 in which a delay may possibly be undertaken. A signal is fed to stage 32 suitable for coincidence at input 33 from stage 34. This can e.g. be a signal such that synchronization pulses which occur outside the retrace are prevented from being transmitted and in the stage 32 prevents the transmission of a signal from the input 31 in such a way that synchronisation pulses can reach the output 35 of coincidence stage 32 only during the retrace. Stage 34 is connected with its input 36 to the level of the lead 7 and with its input 37 to the reference voltage B like the stage 22; stage 34 then provides a signal at its output 38 for as long as the voltage at input 36 is higher than the value B at input 37, i.e. for as long as the charging lasts at capacitor 1.

As there has to be coincidence, that is time correspondence, between input 31 and input 33 of coincidence stage 32, a signal only occurs at output 35 when the synchronisation pulse at input 31 occurs simultaneously with the retrace of the sawtooth voltage $U_1$. This means that synchronisation pulses are then available with the correct phase position and the signal present at the output 35 activates switching stage 12 in such a way that switch 13 is brought into the other position. As a result of this comparison stage 14 becomes inactive and switches 15 and 17 are both open. Since the retrace has just taken place switch 40 is now closed by a second comparison stage 39 and a potential $P_4$ of e.g. 3.32 volts becomes effective on the lead 7 via a transfer stage 41, so that according to FIG. 2 a fall in the voltage $U_1$ would be possible until an instant $t_4$. As long as synchronisation pulses occur the stage 39 is switched by them in such a way that the switch 40 is opened again and a switch 42 lying in parallel to the switch 15 is closed, through which the potential $P_1$ is made effective on the lead 7; as a result of this the retrace commences immediately. This roughly corresponds in FIG. 2 to the dotted line drawn at $t_3$ with the difference that with synchronisation from outside the retrace does not depend on potential $P_3$, but takes place directly.

During the retrace a retrace pulse is supplied by the stage 22, through which the switch 13 could be reset in the position corresponding to the nominal natural frequency via the switching stage 12. In order to prevent this from happening when synchronisation pulses are occurring, that is in synchronised operation, switch 24 is opened when synchronisation pulses occur for the following interval until beyond the next retrace by processing stage 30 via the dotted line and thus the resetting of the stage 12 is prevented.

When the synchronisation pulses disappear after synchronised operation has taken place the sawtooth voltage $U_1$ shown in FIG. 2 decreases longer until the voltage $P_4$ on the lead 7, active because of closed switch 40, is reached. Then comparison stage 39 is switched in such a way that switch 42 is closed again and consequently the retrace commences. Since a synchronisation pulse has not occurred in this interval switch 24 is closed and because of the retrace pulse switch 13 is moved to the position shown via stage 12 in such a way that through comparison stage 14 the levels $P_1$ and $P_3$ are again active alternately and the nominal frequency is switched on.

When a synchronisation pulse arrives it is conducted to comparison stage 39; this then closes switch 45, so that a potential $P_2$ of e.g. 3.65 volts occurs on the lead 7 via transfer stage 44. As long as the voltage $U_1$ remains higher than this value the initiation of the retrace is prevented. In this way it can be guaranteed that interference occurring at the beginning of the trace cannot become effective. The external synchronisation cannot become effective until the capacitor voltage $U_1$ has fallen below the level $P_2$.

Transfer stages 16, 18, 41 and 44 can be formed e.g. by diodes; their effect is that in each case the lowest of the voltages applied simultaneously through one of the switches 15, 17, 40, 42 and 43 becomes effective on lead 7.

FIG. 3 shows a detailed circuit diagram of the circuit arrangement according to FIG. 1. Capacitor 1 with discharging resistor 2 lying in parallel, which on one side is connected to ground, is on the other side connected to the base of npn transistor 51, which together with a similar transistor 52 forms a differential amplifier, the collector branches of which are connected through a current mirror circuit with pnp transistors 53 and 54 to the positive pole of the supply source $+U$ of e.g. 8 volts, whose other pole is connected to ground. Because of the current mirror circuit 53, 54 equal currents flow into transistors 51 and 52. Their emitters are connected to each other and to the collector of a current source transistor 55 whose emitter is connected to ground via a resistor 56 of 2 kΩ. Applied to the base of the transistor 55 is a constant voltage of e.g. 1.0 volts, which is derived from the supply voltage U through a resistive voltage divider 57, 58. From the emitter of npn transistor 59, whose collector is connected to the supply source $+U$ and whose base is connected to the collector of transistor 52, a current is introduced into the circuit of the base of transistor 52 which is connected via diode 60 to another current source transistor 61 with emitter resistor 60 of 2 kΩ.

Transistors 51, 52 and 59 operate as an impedance transformer for the voltage $U_1$ of the capacitor 1, which subsequently occurs on the one hand on the base of npn transistor 64 and on the other, reduced by the voltage drop of approximately 0.6 volts on diode 60, on the bases of npn transistors 65, 66 and 67.

When the circuit arrangement is set into operation it is set at the nominal frequency, the line frequency of 15,625 Hz, by switching stage 12. This stage contains a flip-flop stage with two npn transistors 70 and 71, the emitter of transistor 70 being connected to ground via a resistor 72 of 1 kΩ and the emitter of transistor 71 being connected to ground via resistor 73 of 2 kΩ. The collector of transistor 70 is connected to the base of transistor 71 and also the collector of a current source pnp transistor 74 with an emitter resistor 75 of 2 kΩ connected to the power source $+U$. The base voltage of transistor 74 is fixed to approximately 7 volts by a voltage divider 76, 77 connected in parallel to the supply source. The collector of transistor 71, which is connected to the base of transistor 70 via a resistor 79 of 15 kΩ, is connected to the collector of another pnp current source transistor 80 with emitter resistor 81 of 2 kΩ, the base of transistor 80 being also connected to the base voltage divider 76, 77.

The emitter of transistor 70 is connected to the emitter of npn transistor 82 whose base is connected to the base voltage divider 57, 58. The emitter of transistor 71 is connected to the emitter of npn transistor 83 whose base is connected to the same divider in this way two differential amplifiers 70, 82 and 71, 83 are formed.

At switch on transistor 70 is conductive and transistor 71 cut off. Consequently transistor 83 conducts current and feeds a differential amplifier which consists of npn transistor 67 and npn transistor 85 whose emitter is connected to the emitter of the transistor 67.

Connected to the supply source U is a voltage divider of the resistors 86, 87, 88, 89 and 90 such that voltage level values $P_4$, $P_3$, $P_2$ and $P_1$ of 3.32 V, 3.50 V, 3.65 V and 5.2 V, respectively, can be taken from its taps. Connected to these taps are the bases of npn transistors 91, 92, 93 and 94 belonging to the transfer stages 16, 44, 18 and 41, respectively, and their collectors together control a current mirror circuit of pnp transistors 95 and 96. The collector and the base electrodes of four transistors 97, 98, 99 and 100 are connected to the other branch of the current mirror circuit 95, 96 as shown in combination in the diagram. The emitters of the transistors 91 and 97 are connected to the collector of the transistor 85 and to the collector of npn transistor 101, whose base is connected to that of transistor 85. The emitters of transistors 92 and 98 are connected to the collector of transistor 65, the emitters of transistors 93 and 99 are connected to the collector of transistor 67 and the emitters of transistors 94 and 100 are connected to the collector of transistor 66.

Depending on the drive one of the transistors 97, 98, 99 and 100 is conductive and transfers the base potential of the associated transistor 91, 92, 93 or 94 as impedance transformer to the base of an npn transistor 102 functioning as an emitter follower; its emitter is connected to the collector of a current source transistor 102a, whose base is connected to the tap of the voltage divider 57, 58 and whose emitter is connected to earth via resistor 102b of 2 kΩ. The potential of the base of the transistor 102—reduced by the base emitter voltage—is transferred to the bases of transistors 85 and 101.

In the starting position dealt with transistor 83 conducts current so that transistors 67 and 85, which make up comparison stage 14 represented in FIG. 1 in the form of a differential amplifier, are driven. As the capacitor voltage is 0 and the base of transistor 67 has a minimal value, transistor 85 conducts at first so that the potential $P_1$ of 5.2 volts is transferred to the base of transistor 102 and to the base of pnp transistor 103, whose emitter is connected to that of transistor 64 so that a different amplifier is formed, in whose collector branches is a current mirror circuit consisting of pnp transistors 104 and 105. The emitters of transistors 64 and 103 are connected to the collector of transistor 106 similar to the retrace stage 22 in FIG. 1, whose emitter is connected to a current source which consists of transistor 107 and resistor 108. If in the retrace interval the voltage at the base of transistor 103 is higher than the voltage $U_1$ of capacitor 1 fed to the base of transistor 64 through amplifiers 51, 52, current flows from the connection point of the collectors of transistors 64 and 105 to the base of npn transistor 109, whose emitter is connected to capacitor 1 via resistor 110 of 1 kΩ. Lying between the base and the emitter of transistor 109 is a resistor 111 of 68 kΩ. The capacitor voltage $U_1$ is then transferred via capacitor 112 to the base of npn transistor 113 whose emitter is connected to ground and whose collector is connected to the base of transistor 109. The base of transistor 113 is biased to 0.6 volts through a voltage divider 114, 115 lying parallel to resistor 58 and resistor 116 of 22 kΩ. Achieved by this and by the described feedback circuit with the capacitor 112 is that the capacitor 1 is charged with a given slope of about 1 volt/μs. When the capacitor voltage $U_1$ has reached the value $P_1$ and exceeded it transistor 64 becomes conductive and takes over the current from transistor 105 so that the charging transistor 109 cuts off and the charging is ended. Between transistors 67 and 85 too the sign of the voltage difference reverses so that now transistor 67 conducts current and the voltage $P_3$ of 3.5 volts is transferred to the base of the transistor 98 via the transfer stage (18 in FIG. 1) with transistors 93 and 99. As a result of this the base voltage of the transistor 106 is correspondingly reduced. Its emitter however is connected to the emitter of npn transistor 117, which is connected via a resistor 117a of 47 kΩ to its base and to the emitter of another npn transistor 118. The base of transistor 118 lies at a fixed voltage value B of 4.5 volts and its collector is connected to the supply source +U. The collector of transistor 117 controls a current mirror circuit of pnp transistors 119 and 120.

Because of transistors 117 and 118 the emitter voltage of transistor 106 cannot be lower than about 3.3 volts; transistor 106 is therefore cut off as soon as the base voltage of transistor 102 is lower than 4.5 volts. The supply of current to retrace switching stage 4 comprising transistors 64, 103 is then also blocked and the retrace is ended. Retrace stage 4 is therefore made ineffective by means of retrace stage 22 if comparison level at the base of the transistor 102 assumes a value somewhat below the upper value $P_1$ or even lower.

Capacitor 1 is discharged in the trace interval via resistor 2 corresponding to the curve shown in FIG. 2, until it reaches the voltage $P_3$ because of the conductive transistor 67. Then differential amplifier 67, 85 is switched in such a way that transistor 85 conducts and feeds transistors 91 and 97 of transfer stage (16 in FIG. 1) so that the voltage $P_1$ is transferred to transistors 106 and 103 which again conduct current; in this way the charging stage with transistor 109 is switched on.

During each retrace interval pnp transistor 122, whose base is connected to the bases of transistors 104 and 105 and whose emitter is connected to the supply voltage +U, is made conductive by the current source 104, 105. The collector current of transistor 122 flows via npn transistor 123 connected as a diode to the base of the transistor 70. Since this has already been made conductive in the state described earlier corresponding to the nominal frequency no change occurs.

Outside the retrace transistor 106 is cut off and transistors 117 and 118 conduct current to the current source transistor 107. Consequently, transistor 120 also conducts current and drives the base of npn transistor 125, whose emitter is connected to ground. The collector-emitter path of npn transistor 126 lies in parallel to the base-emitter path of transistor 125 and its base is connected to the collector of transistor 70 via voltage divider 127, 128 consisting of resistors of 22 and 39 kΩ respectively. Since transistor 70 conducts current and therefore has a low collector voltage of approximately 1 volt, transistor 126 is cut off.

Negative synchronising pulses can be supplied from terminal 11. These are supplied to the bases of pnp transistors 130 and 131 whose emitters are connected to the supply voltage +U. The collector of transistor 130 is connected to the collector of transistor 125 and via resistors 132 and 133 of 22 and 28 kΩ, respectively, to the bases of npn transistors 134 and 135 whose emitters are grounded.

If, as described, the circuit is set to the nominal frequency and the trace occurs between two retrace intervals, transistor 125 is conductive and prevents pulses being able to find their way into the circuit from the terminal 11 via transistor 130. So when synchronising pulses occur in the interval shown in FIG. 2 between the instants $t_1$ and $t_3$, they have no effect. Since the frequency of the synchronisation pulses supplied from outside and the frequency of the sawtooth generated by the described circuit are always somewhat different, the synchronisation pulses move in the trace section mentioned until they finally reach the retrace interval.

During the retrace transistor 125 does not conduct current. The synchronisation pulses transferred from transistor 130 in this time period, that is in coincidence, can then be fed with positive polarity to resistors 132 and 133 and therefore to the bases of transistors 134 and 135. Transistor 135 becomes conductive and its collector voltage decreases to a few tenths of a volt, so that transistor 70 becomes cut off. The flip-flop 70, 71 therefore switches so that transistor 71 and also transistor 82 conduct. Transistors 65, 66 and 101 forming comparison stage 39 receive via transistor 82 on their emitters a switching signal which replaces the switching signal previously supplied by transistor 83 and which switches the supply current for the emitters of the differential amplifiers forming the transfer stages 16, 18, 41 or 44, preferably alternately. In the retrace interval the capacitor voltage $U_1$ is lower than the voltage $P_1$. Correspondingly, transistor 101 conducts and transfers the voltage $P_1$ instead of transistor 85. When the voltage $U_1$ reaches the value $P_1$ the retrace ends, as mentioned above, transistor 101 becomes nonconductive, and the current from transistor 82 flows to transistors 65 and 66. Transistors 94 and 100 then take over the current with the lower voltage $P_4$. The base-emitter path of transistor 65 lies in parallel with the base-emitter path of transistor 66; as transistor 66 conducts current transistor 65 is also conductive and it can feed current to transistor 92, if the sawtooth voltage $U_1$ is so far below $P_2$ that the necessary base-collector voltage on transistor 65 and emitter-base voltage of transistor 92 can form. If the sawtooth voltage $U_1$ is higher, no current flows through transistor 65, transfer stage 44 with transistors 92 and 98 becomes operative and at the base of transistor 98 the potential $P_2$ occurs. Then comparison stage 39 with transistors 65, 66 and 101 is not switched and a synchronisation through an initiation of the retrace does not take place.

When the next synchronising pulse occurs at the terminal 11 and transistor 131 becomes conductive, it takes over the current from transistor 66 and thereby interrupts the supply current for differential amplifier 94, 100 forming transfer stage 41. If the sawtooth voltage $U_1$ is lower than $P_2$ to the extent mentioned above so that transistors 65, 92, 98 are cut off, none of the transfer stages 16, 18, 41 or 44 is operative, the potential as the base of transistor 102 is not maintained and rises. If necessary a resistor 137 can be connected between this base and +U. Then the voltage of transistor 65 determined by $U_1$ will be lower than the voltage at transistor 101 and differential amplifier 65, 66, 101 will be switched in such a way that transistor 101 conducts and the potential $P_1$ is transferred; in this way the retrace is initiated by synchronisation pulse. If the base voltage of the transistor 65 derived from the sawtooth voltage $U_1$ is still so high in comparison to $P_2$ that transistor 92 is not rendered conductive by the collector of transistor 65, then no current flows through current mirror transistors 95 and 96; any leakage currents are drawn off via the emitter branch of transistor 102 to the current source transistor 102a. In this way transistor 102 is prevented from rendering transistor 106 conductive in the initial part of the trace between the instants $t_1$ and $t_2$ (cf. FIG. 2) and from initiating the retrace. When the synchronisation pulse occurring prematurely in this way has passed, transistor 94 again takes over the current from transistor 66 and the circuit continues as before until a synchronisation pulse occurs after the instant $t_2$ or the sawtooth is completed until the instant $t_4$.

The synchronisation pulse is fed from the collector of transistor 130 via resistor 132 to transistor 134, whose collector is connected via resistor 136 of 22 kΩ, to the emitter of pnp transistor 137 and to the collector of transistor 122. The base and the collector of transistor 137 are connected to the collector and the base of transistor 134, respectively. In this way a thyristor is formed between the emitters of transistors 137 and 134 which can be ignited by a positive impulse fed via resistor 132 and which goes out when its supply is cut off via transistor 122 (after the end of the sawtooth retrace). When thyristor 134, 137 is ignited by a synchronisation pulse, the retrace pulse fed via transistor 122 cannot reach transistor 70 and reset it to the initial position for the nominal frequency. As long as synchronisation pulses appear, the sawtooth generator remains in the synchronisable position. This does not change until a synchronisation pulse fails to occur and the discharge curve is completed as far as potential $P_4$; the retrace pulse then occurring switches on the nominal frequency position again.

What is claimed is:

1. Circuit arrangement for the generation of a sawtooth voltage at a capacitor, which is charged by a first current, until a first threshold voltage is reached, and is discharged by a second current, until a second threshold voltage is reached comprising:
   a source of synchronization signals,
   means for changing the direction and/or the intensity of the direct current supplied to the capacitor at the instant the threshold voltage is reached, whereby the differences between the first and the second threshold voltage as well as the charge and the discharge current determine the natural frequency of the sawtooth voltage generated, and
   a synchronization signal detector and means for switching said circuit from said natural frequency under the influence of said synchronization signal detector for establishing the presence of said synchronization signal, whereby at least one of the two capacitor charge switching instants can be determined by synchronization signals supplied having a substantially constant nominal repetition frequency, the sawtooth voltage being thus synchronizable by said synchronization signals, and whereby said natural frequency is given substantially the nominal value in the absence of synchronization signals, said synchronization signal detector being implemented as a coincidence circuit to which a signal corresponding to a determined time interval of the sawtooth voltage and a signal corresponding to a determined time interval of the incoming synchronous signal are supplied and which on coincidence of these two signals supplies a signal to a switching stage for switching the natural frequency of the sawtooth circuit arrangement from a value corresponding at least substantially to the nominal frequency to a lower value.

2. Circuit arrangement as claimed in claim 1 wherein the frequency is switched to a value substantially equal to the nominal frequency when a synchronization pulse does not occur before the end of the natural period and the retrace of the sawtooth voltage determines the commencement of the natural frequency.

3. Circuit arrangement as claimed in claim 1 or 2 wherein the retrace of the sawtooth voltage commences when a synchronization pulse occurs, and the natural frequency of the sawtooth voltage has its lower value.

4. Circuit arrangement as claimed in claim 3 wherein the retrace of the sawtooth voltage only commences when a given time or voltage interval has elapsed from the beginning of the period.

5. Circuit arrangement as claimed in claim 4 comprising a processing stage and wherein the synchronization pulse is supplied to the sawtooth switching stage through said processing stage which is only operative if a certain time or voltage interval of the sawtooth signal has been exceeded.

6. Circuit arrangement as claimed in claim 1, comprising a switching stage and an oscillator and wherein a switching signal is supplied to said switching stage which switches said oscillator circuit determining the frequency of the sawtooth voltage from a value substantially equal to the nominal frequency to a lower value when coincidence is present and switches it back to the original situation in the absence of coincidence.

7. Circuit arrangement as claimed in claim 3, comprising a second switching signal and wherein the frequency of the sawtooth voltage is switched back again to the nominal frequency by said second switching signal initiated by the retrace of the sawtooth voltage with a longer natural period.

8. Circuit arrangement as claimed in claim 1, wherein said retrace switching stage is made inoperative when a comparison level takes on a value lower than the highest value.

9. Circuit arrangement as claimed in claim 1, comprising a comparison stage and a transfer stage and wherein said threshold voltages are supplied to said comparison stage by means of said transfer stage, the capacitor voltage being also supplied to said comparison stage which supplies a switching signal if the two voltages supplied are at least substantially equal, said transfer stage being formed by a differential amplifier whose output branches are supplied through a current mirror circuit and which is connected as an impedence transformer, the threshold voltage being transferred through the differential amplifier to said comparison stage, this transfer being effected by means of a switching signal supplied by a switching stage by which the supply current common to both stages of said differential amplifier is switched.

10. Circuit arrangement as claimed in claim 9, comprising two transfer stages whose supply current is switched alternately by said comparison stage which is activated depending on the sign of the difference between the sawtooth voltage and the threshold voltage.

11. Circuit arrangement as claimed in claim 9, comprising three transfer stages, and a second comparison stage, whereby the first transfer stage is switched on alternately to the second and the third transfer stages by said second comparison stage, whereby switching transistors are arranged in such a way that the transfer stage which is connected to the lower threshold voltage conducts current.

12. Circuit arrangement as claimed in claim 11, wherein for synchronization the common current branch of the transfer stage associated with the longer sawtooth period and driven by the parallel transistors of the comparison stage is interrupted.

13. Circuit arrangement as claimed in claim 12, wherein said comparison stage transistors, whose collectors supply the current for the second and the third transfer stages form a parallel arrangement such that when the supply of current to the third transfer stage is interrupted, the second transfer stage conducts current, if the capacitor voltage is higher than the threshold voltage applied to the second transfer stage.

* * * * *